United States Patent
Senogles et al.

(10) Patent No.: US 7,298,626 B1
(45) Date of Patent: Nov. 20, 2007

(54) COMPUTING ASSET MANAGEMENT SYSTEM AND METHOD

(75) Inventors: Brian Lawrence Senogles, Olathe, KS (US); Paul Wesley Taylor, Kearney, MO (US); Nathan Aaron Fink, Lenexa, KS (US); Jeffrey Delzer, Olathe, KS (US)

(73) Assignee: Sprint Communications Company L.P., Overland Park, KS (US)

( * ) Notice: Subject to any disclaimer, the term of this patent is extended or adjusted under 35 U.S.C. 154(b) by 105 days.

(21) Appl. No.: 10/988,075

(22) Filed: Nov. 12, 2004

Related U.S. Application Data

(63) Continuation-in-part of application No. 10/762,420, filed on Jan. 22, 2004, now Pat. No. 7,187,265.

(51) Int. Cl.
*H05K 5/00* (2006.01)

(52) U.S. Cl. .................. 361/752; 361/756; 361/759
(58) Field of Classification Search ............... 60/183, 60/762; 364/900; 395/575, 600; 361/680
See application file for complete search history.

(56) References Cited

U.S. PATENT DOCUMENTS

| | | | |
|---|---|---|---|
| 7,062,648 B2 * | 6/2006 | Moulton et al. ............ 713/153 |
| 2001/0042221 A1 * | 11/2001 | Moulton et al. ............... 714/5 |
| 2002/0107962 A1 * | 8/2002 | Richter et al. ............. 709/225 |
| 2006/0149582 A1 * | 7/2006 | Hawkins ....................... 705/1 |

* cited by examiner

*Primary Examiner*—Tuan T. Dinh
*Assistant Examiner*—Abiy Getachew

(57) ABSTRACT

A system is provided which includes a plurality of nodes on a network which each interface with equipment on in a particular equipment housing. The nodes also interface with a an external database. The network-accessible external database is used to maintain asset management information which is received from the nodes.

20 Claims, 3 Drawing Sheets

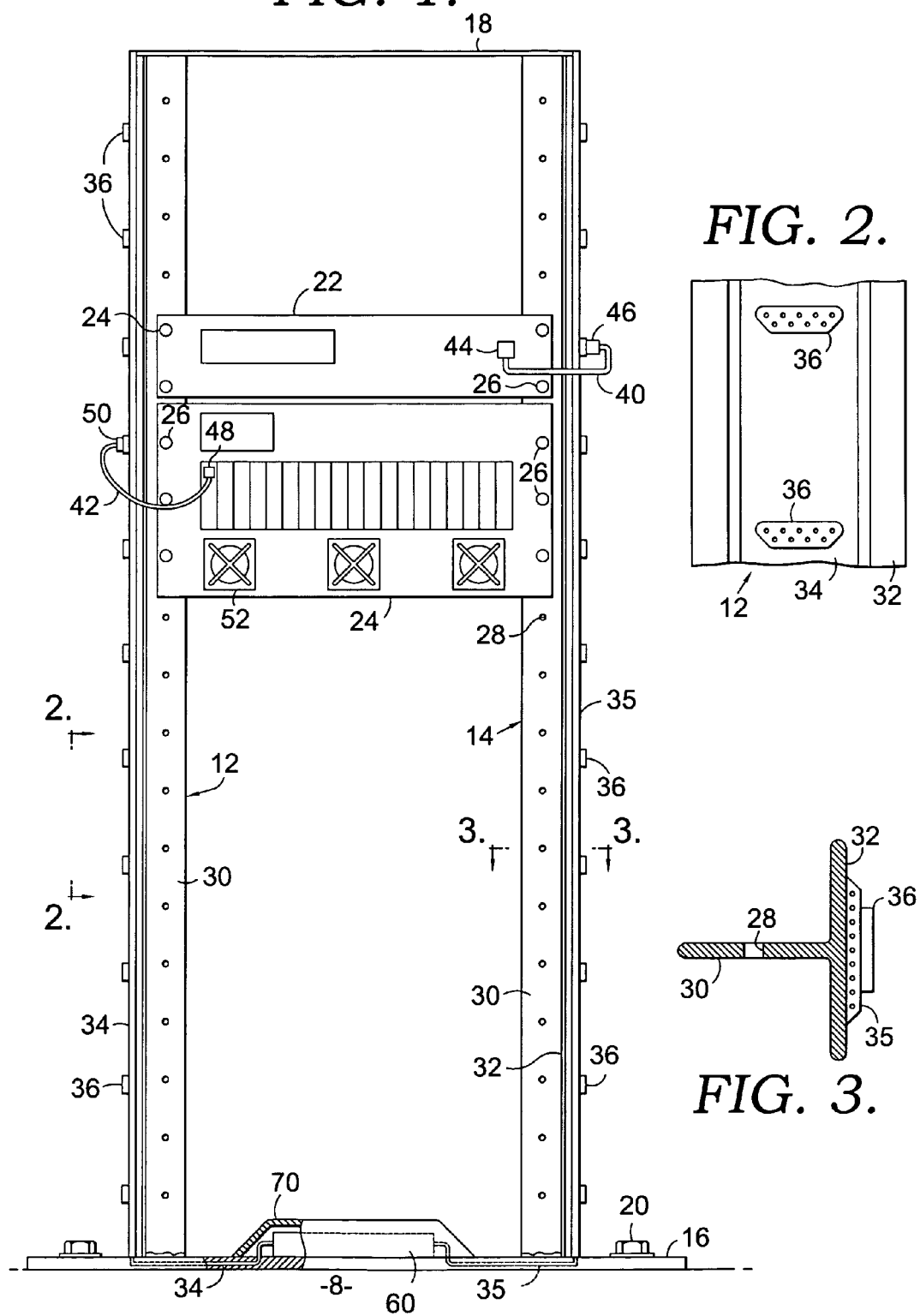

COMPUTING ASSET MANAGEMENT SYSTEM AND METHOD

CROSS-REFERENCE TO RELATED APPLICATIONS

This application is a continuation-in-part of U.S. patent application Ser. No. 10/762,420 filed Jan. 22, 2004 now U.S. Pat. No. 7,187,265.

STATEMENT REGARDING FEDERALLY SPONSORED RESEARCH OR DEVELOPMENT

Not applicable.

TECHNICAL FIELD

This invention relates to the field of housing equipment, such as network servers, telephone switches, power supplies, and the like. More particularly, the present invention provides a new and useful method for monitoring such equipment when it is so housed.

BACKGROUND OF THE INVENTION

Racks for housing equipment, such as servers, switches, routers, and the like are known in the art. With these types of racks, various components are rigidly secured by fasteners. The equipment will typically have a flange on each side which receives a threaded bolt which is used to secure the flange to a reciprocating threaded receptacle on the rack. The pieces of equipment are stacked one on top of the other. For example, on a typical eight foot rack, a telephone switch may be located in the bottom-most part of the rack. A server might be secured immediately above the switch. Then a router might be attached above the server, and so on. The height of such racks may vary dramatically depending on need. Oftentimes, the individual or organization using the equipment racks will assign a particular identifier for each device's position within each rack. For example, the switch at the bottom of the rack may be identified as U1. Immediately above that, the server may be identified as U2. A router stacked above the server may be identified as U3. Thus, the identifier for each rack will increase incrementally until the uppermost piece of equipment on the rack is identified. With the next rack, a new set of identifiers will be used (e.g., starting over again with U1).

Organizational problems oftentimes arise when numerous racks are in use by the same organization. Depending on the organizations communications requirements, it may manage hundreds—even thousands of racks full of servers, routers and switches. These racks may be located in one common place, or scattered in numerous locations geographically. Regardless of location, system administrators oftentimes have problems locating its racks. In fact, it is not all uncommon for an administrator to waste hours, even days searching for a rack that needs some kind of service.

Conventional racks also provide no support when it comes to the system administrator's problem of monitoring the battalions of servers, routers, switches and other equipment within vast arrays of racks. Most individual devices have visual indicators located thereon. These indicators visually inform the user of the failure of some internal mechanism. For example, when a fan goes out, an LED on the exterior of the server (or other device) will become illuminated so that the administrator can visually identify the problem and make the necessary repairs. Like indicators may be used for other sorts of problems, such as failed servers, hard drives, or to indicate that the device has unexpectedly "restarted" for some reason.

When an organization has vast quantities of racks in use at once, the identification of malfunctions by visual inspections of indicators is an overwhelming proposition. Because of this, monitoring systems have been used which enable the detection of equipment malfunctions automatically. It is also hoped when using such systems that the system administrator will be able to locate the particular piece of equipment within the facility including the vast quantities of racks.

One such prior method involves the creation of the client server relationship with an outside firm. With this client/server arrangement, software is installed on each independent piece of equipment within each rack. This special software monitors the functionality of the piece of equipment's hardware. This special software then contacts the server (an external organization) whenever there is a malfunction upon occurrence. The notification may also occur according to a predetermined schedule. The information regarding the malfunction is transferred by way of the already existing computer equipment. Once the server/external organization receives the information, that information, or whatever subset of that information the administration has preindicated a desire to have knowledge of, is transferred to the administrator. This is done so that the administrator may take any actions necessary based on the information.

A second prior art system is also software based. It, like the first, involves the installation of software in each particular piece of equipment. Unlike the first, however, this arrangement is Web-based. When some malfunction occurs, the software causes the system administrator to be contacted over the web directly. Usually via email.

Both of these prior art systems, however, have significant disadvantages. This is because they are dependent on the software within each piece of equipment for quick response to malfunctions. This requires that the device be reprogrammed every time that it is moved. If it is not appropriately reprogrammed, it will be difficult to locate it, especially when numerous racks are in place within a particular facility. Further, the operation of the software within the rack, obviously, is dependent on the functionality of the device. For example, without power, the monitoring systems within the device will obviously fail.

Another disadvantage in these systems regards asset tracking. Presently, the methods used to track rack mounted assets are separate from the monitoring systems. Thus, the conventional methods of accounting for these assets are very time consuming and costly.

SUMMARY OF THE INVENTION

The present invention overcomes the above-stated disadvantages in the prior art systems by providing an equipment housing which has a separate intelligent device disposed thereon, or proximate thereto. In the preferred embodiment, two interfaces are provided in the computing device. The first interface is used for sending and receiving information between a piece of equipment on the rack to the computing device. The second interface is used for sending and receiving information to an external system. With either interface, the information sent or received usually regards either the rack or the equipment disposed thereon. One example of such information might be the malfunction of particular device within a piece of equipment. Another might be the location of a particular piece of equipment in the rack. The computing device also includes a processing component. The processing component is used to manage the information. Also provided is a storage component. The storage component includes nonvolatile memory.

The housing includes a frame. The frame of the present invention has a base number, first and second substantially parallel upright numbers, and a substantially horizontal cross member for securing its upper end.

Information regarding the rack or equipment is transmitted via signals. These signals are transmitted between the equipment and the computing device through an information channel. The information channel is disposed on one or both of the upright numbers of the rack. More specifically, the information channel is a bus which leads from one or both upright numbers down into the computing device. In one embodiment, the computing device is located on the floor of the rack. The floor of the rack may also include a protective cover. The cover is used to form a protective shell in which the computing device is disposed.

BRIEF DESCRIPTION OF THE SEVERAL VIEWS OF THE DRAWINGS

The present invention is described in detail below with reference to the attached drawing figures, wherein:

FIG. 1 is a front view of the housing of the present invention showing a server and a router installed thereon.

FIG. 2 is a side view of one of the upright numbers of the housing of the present invention showing a bust and connectors disposed thereon.

FIG. 3 is a cross sectional view of one of the upright numbers showing how the bust and connectors are attached to the frame.

DETAILED DESCRIPTION OF THE INVENTION

Figure 4:
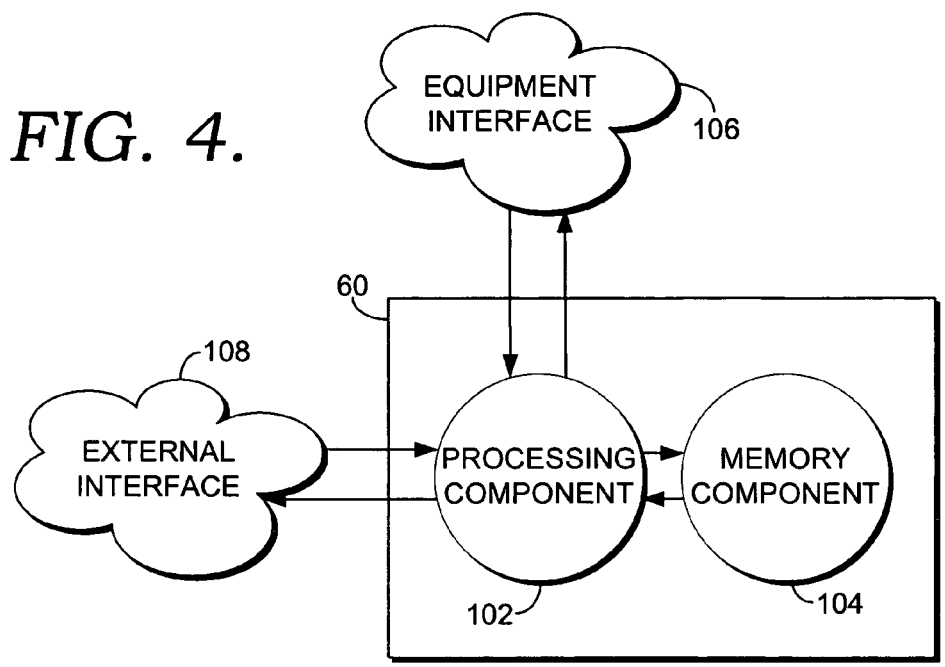
FIG. 4 is a schematic diagram showing the functional components of the equipment-housing-associated computing device of the present invention.

The present invention provides a system and method for housing equipment such as servers, switches, routers, and other computer or telco equipment. A special computing device is used which is associated with, and preferably physically attached to, the housing itself. This small computer is used to identify each of the components on the rack geographically and locationally within the equipment housing. It is also used to monitor anything that might malfunction in any of that housing's equipment. Preferably, the computing device will be used to automatically identify components as they are transferred in and out of the rack. This should be done in a manner such that the computing device will always have knowledge of what is installed on its particular equipment housing and also include geographic information on where that equipment housing is located. This should be possible without having to program and reprogram each individual piece of equipment as it is placed into and removed from the housing. Instead, the computer equipped housing will automatically recognize the presence or absence of equipment. It also will automatically monitor equipment systems once they are installed into the housing with little programming required.

The computing device will always be associated with that particular rack, making it easy to identify the particular piece of equipment at issue when there is a problem, such as a malfunction with that equipment.

The housing of the present invention also comprises a frame. The frame has a base, a pair of substantially upright members, and a cross member joining the upright members. A bus is provided on each of the upright members. Each bus runs down to the computing device which, ideally, is attached to the base of the housing. These busses are electronically connected to, and interface with the computing device. Because the bus is located longitudinally all the way up the upright members, the connections between the equipment and computing device may be easily made.

Throughout the description of the present invention, several acronyms and shorthand notations are used to aid the understanding of certain concepts pertaining to the associated system and services. These acronyms and shorthand notations are solely intended for the purpose of providing an easy methodology of communicating the ideas expressed herein and are in no way meant to limit the scope of the present invention.

Further, various technical terms are used throughout this description. A definition of such terms can be found in *Newton's Telecom Dictionary* by H. Newton, 19th Edition (2003). These definitions are intended to provide a clearer understanding of the ideas disclosed herein but are in no way intended to limit the scope of the present invention. The definitions and terms should be interpreted broadly and liberally to the extent allowed the meaning of the words offered in the above-cited reference. For example, whereas some distinguish the World Wide Web (WWW) as a sub-component of the Internet, "web"—as used herein—should not be construed as limited to the WWW. Rather, "web" is intended to refer generally to the Internet and/or its related networks and components.

As one skilled in the art will appreciate, the present invention may be embodied as, among other things: a device, a method, a system, or possibly a computer-program product. Accordingly, the present invention may take the form of a hardware embodiment, a software embodiment, or an embodiment combining software and hardware. In a preferred embodiment, the present invention takes all of the above-mentioned forms.

Computer-readable media include both volatile and nonvolatile media, removable and nonremovable media, and contemplates media readable by a database, a switch, and various other network devices. Network switches, routers, and related components are conventional in nature, as are means of communicating with the same. By way of example, and not limitation, computer-readable media comprise computer-storage media and communications media.

Computer-storage media, or machine-readable media, include media implemented in any method or technology for storing information. Examples of stored information include computer-useable instructions, data structures, program modules, and other data representations. Computer-storage media include, but are not limited to RAM, ROM, EEPROM, flash memory or other memory technology, CD-ROM, digital versatile discs (DVD), holographic media or other optical disc storage, magnetic cassettes, magnetic tape, magnetic disk storage, and other magnetic storage devices. These memory components can store data momentarily, temporarily, or permanently.

Communications media typically store computer-useable instructions—including data structures and program modules—in a modulated data signal. The term "modulated data signal" refers to a propagated signal that has one or more of its characteristics set or changed to encode information in the signal. An exemplary modulated data signal includes a carrier wave or other transport mechanism. Communications media include any information-delivery media. By way of example but not limitation, communications media include wired media, such as a wired network or direct-wired connection, and wireless media such as acoustic, infrared, radio, microwave, spread-spectrum, and other wireless media technologies. Combinations of the above are included within the scope of computer-readable media.

The equipment housing of the present invention is shown in detail in FIGS. 1-3. Referring first to FIG. 1, the equipment housing is shown as mounted on a floor surface 8. Though it is shown mounted on floor 8, other arrangements are certainly possible which would fall within the scope of this invention. Oftentimes in the prior art similar frames have been mounted to the ceilings, or elevated surfaces. The actual location in which the frame is mounted is not essential to the invention.

Structurally, the housing includes a frame 10. Frame 10 comprises a first upright number 12, a second upright number 14, a base member 16, and a cross member 18. In the preferred embodiment, all of numbers 12, 14, 16, and 18 are comprised of metal. They could be, however, comprised of any material, which has properties, which satisfy the required structural and physical requirements for such a device. Thus, the frame of the present invention is not intended to be limited to any particular kind of material.

Frames with structures similar to those of frame 10 are known in the art. For example, it is known to provide a frame having two upright numbers, a base member, and a cross number to support computer, telephone-related, or other equipment. In fact, the particular frame construction of the present invention should not be considered as a limitation here. There is numerous equipment housing devices known in the art with which the devices and methods of the present invention could be utilized. Some examples of such devices include equipment cabinets, sliding racks, inter alia. The examples of housing devices, which could be used to accomplish the objectives of the present invention, are too numerous, in fact, to mention here. Such devices, however, would also fall within the scope of the present invention if used for the purpose of pursuing the invention's devices and methods.

The cross-sectional shape of upright members 12 and 14 is the same. As may be seen in FIG. 3, which is section 3-3 taken from FIG. 1, upright member 14 has a T-shaped cross section. Though FIG. 3 discloses only a cross-sectional view of member 14, it should be understood that member 12 has an identical (though reversely-oriented) cross-sectional configuration.

The upper ends of upright members 14 and 16 are shown in FIG. 1 as being secured to one another by cross-member 18. Cross member may be a bar. Alternatively, it could have a T-shaped cross-section like members 12 and 14. It may be assembled by welding or using fasteners.

At their lower ends, upright numbers 12 and 14 are supported and connected by base 16. Base 16 is shown here as a simple plate of metal. Other alternative configurations, however, would be evident to one skilled in the art. Thus, the actual configuration of base 16 is not considered to be limiting in any affect with respect to the present invention.

Base 16 is secured to floor 8 using fasteners 20. Fasteners 20 may be bolts, screws or any other fastening mechanism known in the art, which is used to secure frame 20 to the floor through holes, drilled in base 16. As mentioned above, frame 10 could be secured from above as well and still fall within the scope of the present invention.

Shown disposed in rack 10 in FIG. 1 are two pieces of equipment. A first piece of equipment 22 is a server. Servers are well-known computing pieces of hardware used to manage large volumes of data traffic. Servers may be used for numerous purposes. These purposes will be known to those skilled in the art, and the specific use of server 22 is not critical.

Equipment such as server 22 will typically have a number of cables exiting from the backside thereof. Though these cables are not pictured, one skilled in the art of maintaining like equipment will know of them and how they appear. One of these cables is typically a power cord. This power cord (not pictured) is usually plugged into an outlet (also not pictured). The outlet may be located at some location external of the frame 10. Oftentimes, however, outlets are provided on the frame itself into which power cords may be plugged. Just because outlets are not shown in the FIG. 1, it should be understood that either of these, or other outlet configurations would fall within the scope of the present invention.

Besides the power cords, numerous other cables and/or lines also exit from the backside of each piece of equipment. These cables allow the equipment to perform its designated functions. With a typical server, very heavy data volumes may be handled in and out through these cables.

Immediately below server 22 in FIG. 1, is a router 24. A router is a large computer that determines the path of network traffic flow. Path selections are made from several paths based on information included in signals. These signals contain information relating to specific protocols and algorithms that identify the shortest or best paths for data flow. The algorithms also identify other criteria like matrix or protocol-specific destination addresses. Like server 22, router 24 has a power cord and numerous data channel cables emitting from its backside. None of these items are pictured in FIG. 1, but one skilled in the art will know them to be inherently present. It will be well known to a practitioner in the art the way cabling and the power cord are handled and managed behind such a device. Router 24 (as well as server 22) will have cables running to other pieces of equipment, as well as possibly some cables running to external devices. In many respects these arrangements are only limited by the operator's desires.

Each of devices 22 and 24 are attached to rack 10 using a plurality of fasteners 26. These equipment fasteners 26 are screwed through flanges on the equipment. The flanges have apertures that receive the fasteners (e.g., bolts) there through. Once through the apertures, these bolts are received by a plurality of threaded receiving bores 28. It can be seen in FIG. 1 that receiving bores 28 are disbursed along the length of upright members 12 and 14.

It will be abundantly apparent to one skilled in the art of caring for rack-mounted computer or telecommunications equipment that the FIG. 1 arrangement with a single server 12 and single router 24 on a rack is not the only arrangement possible. Equipment housing 10 could obviously hold much more, and different equipment. The arrangement shown in FIG. 1 is not necessarily typical. Typically, numerous other devices could, and probably would, appear on rack 10 to fill the vacant space. The number of devices on the rack is only limited by the space available on the rack.

In typical rack arrangements, the lowest piece of equipment on the rack, would typically be given an identifier, for example "U1." The next piece of equipment above it would be identified as U2, and so on. Here, however, only two devices have been shown on the rack in order to better illustrate the equipment housing itself as well as the system-monitoring intelligent device. The details regarding the computing device and equipment housing will be discussed in more detail hereinafter.

With respect to the equipment-housing frame 10, referring now to FIG. 2, we see the details of the upright members 12 and 14. FIG. 2 is a detailed breakout section 2-2 taken of the first upright member 12. From this view, it may be seen that a flat outer portion of the frame 32 has mounted thereon in a first information channel 34. It may also be seen that a plurality of connectors 36 are attached on. These connectors 36 on member 12 are electrically connected to a first information channel 34. It may be seen that channel 34 extends up the substantially the entire length of member 12. It may also be seen that the connectors are intermittently dispersed and up the entire length of member 12 and electrically tapped into channel 34.

Though not shown from the side (like member 12 is in FIG. 2), It should be recognized that the equipment-communications features of second upright member 14 are the same. Referring to FIG. 1, member 14 has a second information channel 35 thereon, which extends substantially the entire length of member 14. Channel 35 is fixed to a flat outright portion 31 of member 14. It also has disposed thereon, and electrically connected thereto, a second plurality of connectors 37.

It should also be recognized that, though the embodiment shown in FIGS. 1-3 possesses information channels on both upright members, a housing could be alternatively constructed such that an information channel is only provided on one upright member. Such an embodiment would simply have either information channel 34 or information channel 35—not both. Two channels have been selected for the preferred embodiment, however, in order that the devices housed may be more easily connected into the channels.

FIG. 3 shows the features of second upright member 14 from a cross-section view. FIG. 3 is derived from a section 3-3 taken in FIG. 1. From the figure, it is evident that receiving bores 28 are defined within an inwardly extending portion 30. Portion 30 extends inward from the flat outright portion 32 of member 14.

Also evident from FIG. 3, is that flat outer portion 32 along with inwardly extending flange create a cross-sectional T-shape and that second information channel 35 is disposed atop the "T." The plurality of connectors 37 are electrically connected with the second information channel 35 and are dispersed all the way up member 14.

Though the cross-sectional arrangement (like that shown in FIG. 3 for member 14) is not shown for the first upright member 12, it should be noted that a cross-section of member 12 would show the exact same arrangement, except that it would be rotated 180 degrees. Like with the FIG. 3 arrangement, member 12 has an inwardly extending portion 29, a flat outright portion 31. Portion 31 extends inward from the flat outright portion 31 of member 12. Flat outright portion 31 along with inwardly extending portion 29 creates a cross-sectional T-shape—just like with the FIG. 3—shown member 14 arrangement. A first information channel 35 is disposed to the outside of flat outright portion 31. Plurality of connectors 36 are electrically connected with information channel 34 and are dispersed all the way up channel 34 on member 14.

With respect to the particular devices used in the embodiment disclosed in FIGS. 1, 2, and 3, first information channel 34 and second information channel 35 are a data buses. Also in this embodiment, connectors 36 and 37 are each a series of RS-232NV.24 pin-out connectors. These kinds of buses and connectors are well known in the art for the purpose of making a serial connection. And that is what they are being used for here. Because of the relatively low volume of data traffic required through buses 34 and 35, a serial-type connective arrangement will be sufficient.

It is important to note, however, that though these particular devices are used in this instance, it will be abundantly clear to one skilled in the art that other types of arrangements for making the necessary connections could be used instead, and still fall within the scope of the present invention. For example, a USB or fiber optic arrangement could be made as well in order to accomplish the desired objectives. A wireless arrangement could also be used to interface between the computing device and equipment. In such a case, information channels would be unnecessary. Numerous other arrangements could be used also. Here, the prescribed devices have been selected simply because of low-cost and because high volumes of data transfer will not be necessary through the information channels 34 and 35.

From FIG. 1, it will be evident that first information channel 34 and second information channel 35 converge into a common device. This device is an intelligent computing device 60, the components of which will be described later.

It will now be described how the equipment disposed in the equipment housing, including server 22 and router 24, are connected to computing device 60 using information channels 34 and 35. This connection, with respect to server 22, is made using a data conduit 40. Data conduit 40 has two ends. At one end, conduit 40 has an equipment connector 44. Receptacles in which equipment connector 44 may be electrically connected with server 22 are oftentimes existent on the front sides of such devices. Such receptacles are commonly used for accessing the server via a lap top computer or some other kind of computing device. The receptacle on server 22 (not shown) is used to tap into channel 35 by snapping in connector 44. At the other end of conduit 40, a bus connector 46 is used to connect into one of the plurality of connectors 37 on information channel 35. Thus, using connectors 44 and 46, conduit 40 is able to make a serial connection between server 22 and information channel 35.

Again, this is a simple serial, or other types of connections may be accomplished in numerous ways known to those skilled in the art. In this embodiment, however, a simple serial connection is satisfactory considering that only small amounts of data will be transferred across conduit 40. This "smallness" is relative to the much greater traffic that is transmitted in and out of the equipment through the larger conduits emitting from its back (not pictured).

Router 24 is connected into information channel 34 in a similar manner. Referring to the embodiment shown in FIG. 1, this connection is made into channel 34 using a second data conduit 42. Like with conduit 40, conduit 42 has connectors at each end. At one end an equipment connector 48 is provided in order to make a connection into router 24. Like with servers, a receptacle will be typically provided on the front of routers (and other pieces of equipment) such that connections may be made. At the other end of conduit 42, a channel connector 50 is provided which is hooked up with one of the plurality of connectors 36 on the first upright member 12.

Though the server 22 and router 24 in FIG. 1 are shown connected to channels 34 and 35, respectively, it will be apparent to one skilled in the art that either device could be connected into either channel. The decisions of which connector (of the first and second pluralities 36 and 37) should be used, and the decision of which channel (of first and second information channels 34 and 36) the equipment should be connected into are made easy by the present invention because of these possibilities. The fact that the possible connections may be made in any of the connectors comprising pluralities 36 and 37, makes the frame very versatile and able to connect a wide variety of equipment thereon. Again, because the pluralities connectors 36 and 37 are provided essentially all around the rack, the decision of which connector to hook up with depends entirely on which of the available connectors 36 is the closest into which a serial connection may be made. This makes it extremely easy for the user to make the required serial connection into the computing device 60.

The particular equipment-connection arrangement shown in FIG. 1 is not intended to limit the scope of the present invention in any respect. One skilled in the art will recognize that there are many ways in which the equipment could be connected.

When a piece of equipment is connected into one of the information channels, and an initial connection is made, computing device 60 must be configured to send and receive the appropriate information from the equipment. As already specified, the equipment will have software already installed, or added, that is capable of monitoring the equipment's systems and has information regarding that equipment stored therein. When the computing device 60 is connected, and thus, given communicative access to the equipment, it must be configured to that particular piece of equipment. This may be done in one of two ways.

First, computing device 60 may be manually configured by a user. One skilled in the art of configuring computers will be able to do this. Such methods are not new. This may be done by interfacing with device 60 using a laptop computer or other means.

A second way of configuring computing device 60 to the particular piece of equipment occurs automatically. With the automatic method, a user will program computing device 60 to automatically configure to equipment when it is connected. For example, a large organization may have thousands of pieces of equipment on numerous different racks. The organization may install software on each of its owned pieces of equipment that works with software installed on each computing device 60 on each housing to accomplish this automatic configuration. Alternatively, the device manufacturer or OEM may pre-install the software required to auto-configure the computing device 60.

Computing device 60 will now be discussed in more detail. First, it is evident in FIG. 1 that a protective cover 70 may be optionally provided to physically protect device 60. It will also be seen that, in the FIG. 1 embodiment, conduits 34 and 35 pass down into the computing device 60 in a slot (slot is not shown specifically) so that channels 34 and 35 are also protected. The arrangement, however could be much different and still fall within the scope of the present invention. For example, channels 34 and 35 could simply be run along the top of base 16 uncovered. Additionally, cover 70 could be removed and device 60 simply exposed. The way in which channels 34 and 35 are connected to computer 60 should not be considered a limitation in terms of the specifics regarding how the channels are handled with respect to base member 16.

It is required, of course, for the devices to function that they be communicatively connected in some means, however. This communications connection could comprise an electrical connection (as shown in FIGS. 1-3), but could also comprise an optical or wireless communications system.

It is also possible that in the electrical connection disclosed in the embodiment shown in FIGS. 1-3, channels 34 and 35 could also be joined prior to entering the computing device. They may also be joined after entering device 60. They could also be not joined, and each given access to computer 60 via different interfacing systems.

The channels will make an electronic connection with device 60 in a manner known to those skilled in the art. One familiar with the art will know how to make a simple serial connection to a computer such as the one used here as computer 60.

The details regarding the internal components of computing device 60 are shown schematically in FIG. 4. From the figure, it may be seen that computing device 60 comprises a processing component 102 and a memory component 104 that are functionally inter-related. Processing component 102 comprises a functional unit that consists of one or more processors and serves to interpret and execute instructions. Memory component 104 comprises at least some addressable storage space in the device.

So that computing device 60 may communicate, two interfaces are created. The first is an equipment interface 106. This is the interface that is created through information channels 34 and 35. Equipment interface 106 is what is used to send and receive information to the equipment through the serial connection created through information channel 34 and 35.

The information communicated may be of a variety of types. The information could include, for example, information such as storage space available on hard drives within the device. Further, it could include a warning message that a device has malfunctioned on one of the pieces of equipment. Using router 24 as an example it may be observed that a plurality of fans 52 exists thereon. If one of fans 52 should malfunction, a message could be delivered to computer 60 through channel 34 by way of the equipment interface 106 so that processing component 102 (using memory component 104) could record this event. Another example of information that could be transmitted is that of a server being disabled. Further, information could be transmitted regarding whether one of the pieces of equipment has become unplugged or has power failure for another reason. All of this information would initially be received through interface 106. Another form of information can be transmitted is location information. For example, the equipment identifier (e.g., U1, U2, U3, . . . ) might also be received through interface 106.

Though the embodiments disclosed in FIG. 4 shows only one equipment interface, it is of course, possible that additional interfaces could be used for the same purposes—receiving messages from and sending messages to the equipment. For example, channel 34 could be received by device 60 through one interface, and channel 35 could be received through a separate interface. Both arrangements would fall within the scope of the present invention.

A second interface, external interface 108, is used for the purpose of giving the system administrator access to equipment information received by computing device 60. Access may be given by the system administrator in any number of ways. First, a port could be provided on the computing device 60 which would give the system administrator access to device 60 using a laptop computer in a manner known that will be evident to those skilled in the art. External interface 108 could also take the form of an internet or other type of network connection. Other forms of enabling the system administrator to interface with device 60 will be evidence to those skilled in the art and all fall within the scope of the present invention. Further, plural interfaces for making external connections may be existent on device 60 for a plurality of notification and accessing purposes. All of these arrangements would also fall within the scope of the present invention. The embodiment presented in FIGS. 1-4 is very basic, however, this simple version has been selected to make the invention more easily understood.

In the embodiment disclosed herein, computing device 60 is a microcomputer. Other types of computing devices, however could be used as well and still fall within the scope of the present invention.

One feature yet unmentioned, is that a computing device 60 must be powered by a power source of some sort. Batteries could, of course, be used for this purpose. It is more common, however, to use some kind of external power cord, which will be connected to the device. Though obviously necessary to made the computing device 60 function, it is not shown in any of the figures.

Another feature of the invention that has not yet been discussed, is the entity or entities by which the external interface might be used. One such entity might be a centralized computing system. Such a system might monitor a great number of equipment housing devices such as that disclosed as housing 10 in this application. Possibly hundreds or even thousands. This centralized computing system would be tapped into by each computing device like computing device 60 on each rack in order that equipment information with respect to each rack. The information is maintained in such a manner that all equipment information (e.g., geographic locations, rack positions, working status) would be available to the system administrator at all times. Furthermore, the system may be used to enable the system administrator, by his or herself, or through the efforts of others to immediately (i) locate malfunctioning devices, (ii) ascertain the remaining capacity on any device, or any other equipment-related information desired.

Figure 5:
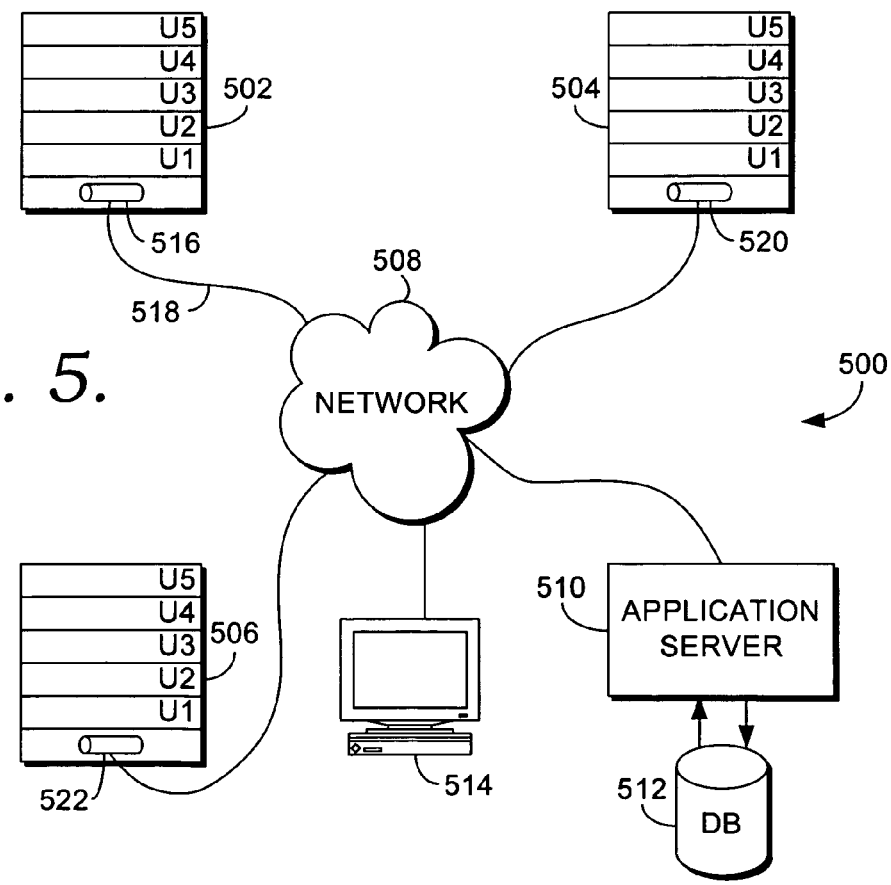
FIG. 5 shows an environment in which one embodiment of the present invention may be practiced.

One embodiment for such an arrangement is disclosed in FIG. 5. Referring first to FIG. 5, we see that the system of the present invention is includable in a particular environment 500 in one embodiment. In this embodiment, a plurality of smart racks are employed. A network 508 includes a plurality of smart racks, e.g., smart racks 502, 504, and 506. The smart racks 502, 504, and 506 disclosed in this FIG. 5 embodiment are substantially identical to the smart rack shown in FIGS. 1-4. Each of these smart racks are included in network 508 by way of a node. Smart rack 502 has a node 516. Smart rack 504 has a node 520. Smart rack 506 has a node 522. Node 522 can be any sort of addressable device which is attachable to a network. Even though node 522 here is disclosed as a microcomputer, it could be another type of addressable networkable device and still fall within the scope of the present invention. It is used here as an intermediary between the equipment in the rack and the rest of the network. Nodes 516, 520 and 522 are all, in one embodiment, identical to the microcomputer 60 shown in FIGS. 1 and 4.

The components which will comprise the data center accessible to individuals comprises two parts in this embodiment. First, an application server 510 is included in network 508. This may be a commercially available web server such as an Apache or other type of server. Also a part of the data center of the system of the present invention is a database 512. Database 512 may actually be included within application server 510, or, as shown here as being separate but still accessible from application server. One skilled in the art will recognize that numerous arrangements known to those skilled in the art will be creatable which would fall within the scope of the present invention.

A client 514, e.g., a workstation, will typically be used to access the data center through network 508. Whether it is a workstation, laptop computer, entire computing system, or other kind of automated client, client 514 is merely a single example of what would more likely be a plurality of such devices on the network. Only one is shown here, however, to keep things simple. The particular embodiment of client 514 is not of importance, and should not be considered a limitation here. The only important thing is that some means of access be provided to users into network 508.

Looking again at the smart racks 502, 504, and 506 which are included in this embodiment of the system, we see that each piece of equipment installed has a position identifier. The numbering of these identifiers—U1, U2, U3, U4, and U5 are numbered from bottom to top. Each of these identifiers denotes a particular rack location. Node devices 516, 520, and 522 are interfaceable with equipment at each of these locations (U1, U2, U3, U4, and U5). In this embodiment, the nodes are fixed or maintained in close proximity with each of the racks in order to maintain an association with that rack. In the preferred embodiment, these nodes will be permanently fixed to the racks and thus, information obtained from the equipment at any of locations U1 through U5 will be easily recognized as being at a particular location and in an exact orientation.

Though not shown in FIG. 5, each of the nodes, node 516 e.g., has an equipment interface which enables it to communicate with each of the devices at any of the locations. For example, node 516 will have an equipment interface which enables it to communicate with a device at location U1 (or any other location). This equipment interface might be the same as interface 106 shown in FIG. 4. There will also be some kind of wired (e.g. database) or wireless (e.g. YFI) means of connectivity between the equipment interface and the equipment itself.

There will also be an interface from the node into the network. This would be the equivalent of interface 108 in FIG. 4. This interface is used by the node to communicate with external devices on the network. Devices like application server 510. The interface also enables the node to be accessed by devices on the network (like server 510).

Now that all of the devices and arrangements of the present invention have been disclosed, we will address the way in which the system works. One step in accomplishing the present invention, is that the organization will program each equipment device (e.g., server 22 and router 24) with software that is designed to recognize computing device 60. Likewise, computing device 60 will be programmed in such a way that it may interface with each piece of equipment. Such programming techniques will be within the scope of that known to those skilled in the art.

The software installed on the equipment will be designed to transport only very specific information to computing device 60. This will be information regarding the status of that particular piece of equipment. For example, its precise location in the rack, its available processing or memory space, or other hardware-related conditions that might be of interest to the system administrator. The information delivered could also be event-related. For example, whenever a fan such as fan 52 were to malfunction or "go out," this information could simultaneously be passed on to computing device 60 through equipment interface 106. Computing device 60 could then store the event in memory component 104, so that the administrator could obtain this information at a later time. Alternatively, the fan-malfunction-message could be instantly delivered to the system administrator over interface 108 by the internet or other means of message connection. This would enable the system administrator immediately repair the condition because the computing device 60 will be able to inform him or her the exact geographic rack location and the exact equipment position within the rack such that time is not wasted.

Figure 6:
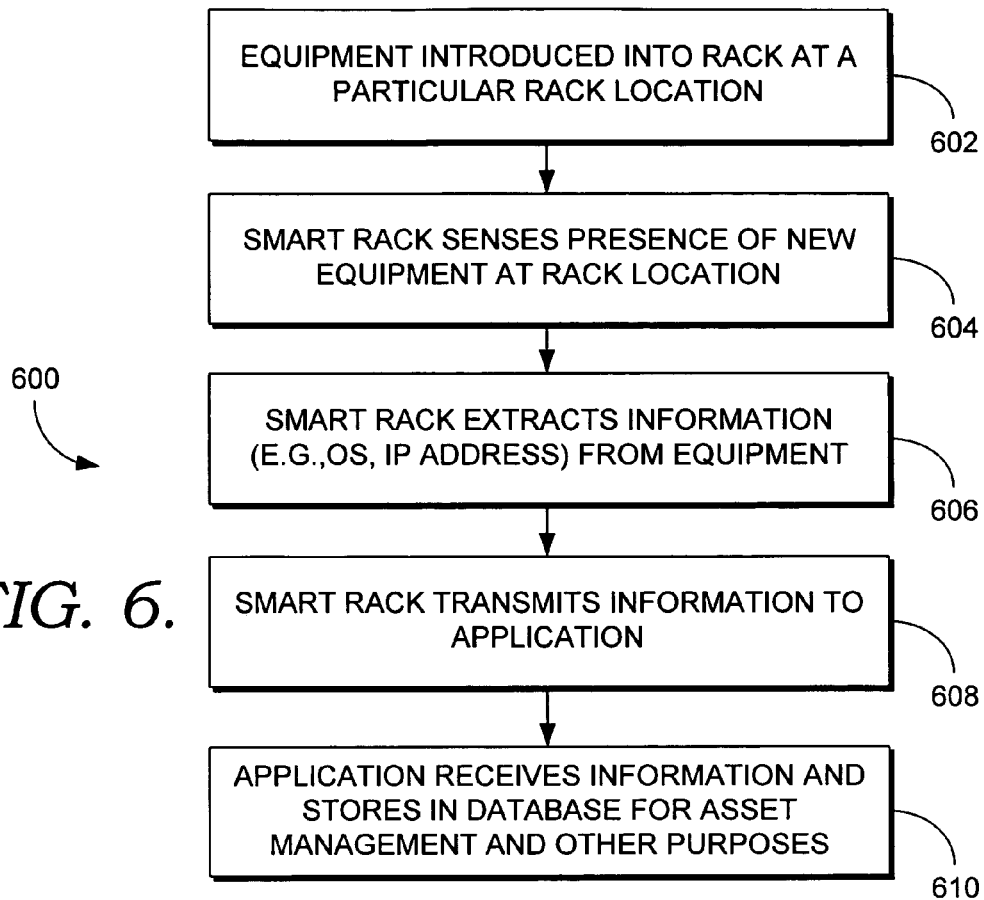
FIG. 6 is a flow chart showing how the network-accessible asset-management database of the present invention is populated.

One embodiment of the present invention showing the way in which the network-accessible database 512 (see FIG. 5) of the present invention is automatically updated is revealed in FIG. 6. Referring to the figure, we see that an embodiment 600 of the auto-update process includes numerous steps.

In a first step 602, the particular piece of equipment, e.g., a server, router, switch, or some other form of computing equipment is introduced into the smart rack. For example (referring now to FIG. 5), a server might be installed at position U2 in rack 502. The installation is accomplished by using fasteners to attach it to the rack and then making the necessary electrical connections at the back of the server. Also included in this step is that the server must be somehow placed in communication with the node 516. This connectivity could be accomplished using a physical bus as shown in the FIGS. 1-4 embodiment, some other sort of physical connection, or by some kind of wireless interfacing arrangement.

After the equipment has been installed and all of the necessary connections made, in a step 604 the smart rack senses the presence of the newly installed equipment at the rack location. This sensing may be accomplished by programming the microcomputer node 516 to automatically recognize a device installed at position U2 when that device is powered up. One skilled in the art will know how this can be programmed into microcomputer 516. Alternatively, an arrangement could be set up in which the device installed at location U2 would be recognized without even being powered up. This might be accomplished by maintaining a small battery within the device being installed which is sufficient to signal the microcomputer 516. The battery would supply enough power to enable messaging between the node 516 and the server installed. Other arrangements are possible that would fall within the scope of the present invention. Software running on the microcomputer 516 recognizes a device being installed at the particular rack location.

Once this has occurred, the extraction process begins. At this point in a step 606 the smart rack will extract equipment information from the device (e.g., server) installed. This information may include e.g., the operating system running on the computing device. It also might include the device's IP address, and physical size specifications. Other less permanent information might also be obtained. For example, the device's temperature might be received. These less permanent properties would also likely be routinely monitored as will be discussed later.

Once this information has been received by the smart rack node/computer 516 in a step 608 this information will be transmitted to an application running on application server 510. More specifically, the node will transmit the information via an information conduit 518 (e.g., via an Ethernet connection) making it available to network 508. Application server 510 in a step 610 will receive the information over the network and store it in a database 512 where it may be later retrieved. Once stored and maintained in database 512, the information may be used for asset management and/or other purposes by users on the network 508.

FIG. 6 shows the transfer of equipment information immediately upon the installation of a device into the smart rack. There is also continued monitoring after installation, however, after installation. Though not shown in the FIG. 6 flow chart, or elsewhere, it should be understood that this process would follow essentially the same step by step procedure. According to this monitoring process, the application includes a schedule. Microcomputer 516 will be prompted by this schedule to periodically retrieve status information, (i.e., temperature, functionality) regarding the equipment housed in rack 502. Microcomputer 516 will then be programmed upon such request to retrieve the information from the devices in the rack and then transmit this information over the network to application server 512. If this involves, e.g. a temperature reading being taken from the device at position U2, that information will be transferred over the network and saved in database 512 where it could be accessed at will by a client using client workstation 514. The user will be able to review the temperatures of all the devices in the same rack to determine if there is a uniform temperature problem.

Alternatively, node 516 (microcomputer) could have routines running on it which cause it to automatically and periodically monitor the information regarding the equipment at various locations in the rack. With this arrangement, the microcomputer 516 upon periodically retrieving this information would on possibly the same or possibly a separate schedule transmit the data to the application running on the application server 510 without any prompting by the application. The application, upon receipt of this information would be programmed to store it on database 512 for future use.

It is also possible that both the application on server 510 and routines running on nodes 516, 520, and 522 would each have independent schedules running on each.

Though the functionality regarding rack 502 on the network 508 has been discussed already, it is important to note that these same processes are followed regarding racks 504 and 506. These racks also use their nodes 520 and 522 to assist in generating information in a centralized database. The result is that database 512 will include accessible information regarding the status, identities and locations for all of the devices included in all of the racks.

Figure 7:
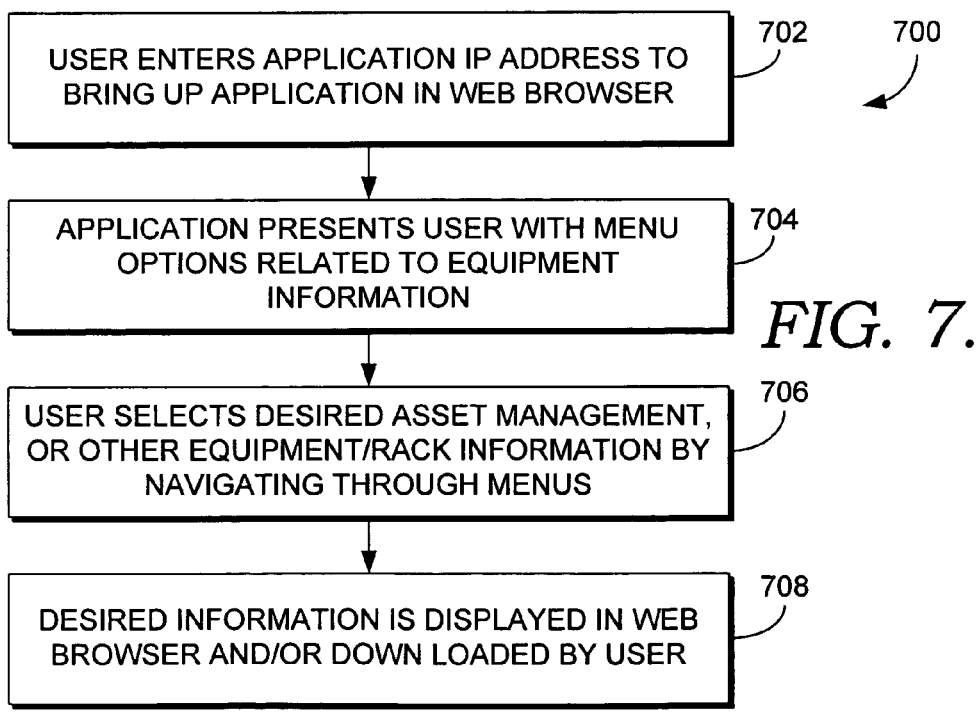
FIG. 7 is a flow chart showing the steps a client might take to access the asset-management database over the network.

FIG. 7 shows a process 700 which includes a plurality of steps which make up the way a user is able to access information from database 512 to use it for asset management purposes. To begin this process in a step 702 the user enters the application's IP address in order to bring up the application in their web browser. This might occur, for example, using workstation 514 where a systems administrator is interested in learning about some or numerous pieces of equipment in one of the systems.

In a next step 704 the application presents the user with many options which relate to a variety of equipment information. For example, by navigating through various menus the user is able to narrow the search down to a particular location. This might enable the user to make queries regarding the equipment in specific racks at that location or to access cumulative data regarding the racks.

In a step 706 the user takes advantage of the menu options provided. This is done by selecting the desired asset management or other equipment or rack information by navigating through the menus. With this menu set up, the user will be able to manage the computing assets electronically. E.g., a user may receive a work order requiring the deployment of 3 servers in Miami. By navigating through various menus, the user could select the state (Florida), then the city (Miami) and obtain a list of buildings in that city. The user would then be able to select buildings of interest. Once a particular building is selected, the user will be able to see all of the racks in the building. Perhaps even select a floor. E.g., all the racks on the 7$^{th}$ floor. Once this subgroup of racks (all of those on the 7$^{th}$ floor) is selected, the user will be able to select different racks (represented by nodes), or a particular rack from which it is desired to obtain equipment information. The node from the rack selected will have been routinely supplying information into the database 512 in the manner described above. Thus, this information is made available.

In a step 708, the user is able to gain useful information by having it displayed in his or her web browser. Alternatively, the information could be downloaded. Downloading might be advantageous in situations where vast amounts of information is being pulled out of database 512. Referring back to the 3 server/Miami example, information could be displayed regarding each of the racks on the 7$^{th}$ floor. The user could find a particular rack with open space which would receive one of the servers. The user could also obtain from the information in the database how big the space available is, and if there are enough outlets in the location. Other information might also be obtained.

It is important to note that though the preferred embodiment has been described as using a centralized computing center for monitoring all the racks operated by a particular organization, that the interfacing could be done in a much different way. Alternatively, a system administrator could simply move from rack to rack periodically and hook up to a port on computing device 60 to accomplish the interfacing. At this point, the system administrator would be able to retrieve the desired information into, say, for example, a laptop computer. Thus, the equipment could be periodically monitored.

Other asset-management advantages of a grand scale would also be possible with the above-described system. Because a centralized computing database operated by the organization would be able to immediately ascertain how many devices (equipment) were presently operating under the current system, the organization could easily ascertain how many units and what type of units were operating on the system currently without making an extensive accounting thereof. With the conventional systems, this is an arduous task. This is because a device will not appear on a system until it is programmed therein. These programming techniques have proved to be very unreliable and lack comprehensiveness. For example, it is not uncommon for a system administrator to "discover" a device in a rack, which has been abandoned, forgotten, or misplaced. The equipment housing of the present invention 10 would overcome these dilemmas.

Another advantage provided by the present invention is in the area of theft deterrence. With the equipment housing of the present invention, the system administrator may be immediately alerted if devices have been removed from their assigned racks. Because these devices, such as server 22 and router 24 tend to be very expensive, this is a very significant advantage as well.

As can be seen, the present invention and its equivalents are well adapted to provide a new and useful equipment housing which may be used to monitor equipment. Many different arrangements of the various components depicted, as well as components not shown, are possible without departing from the spirit and scope of the present invention.

The present invention has been described in relation to particular embodiments, which are intended in all respects to be illustrative rather than restrictive. Alternative embodiments will become apparent to those skilled in the art that do not depart from its scope. Many alternative embodiments exist but are not included because of the nature of this invention. A skilled programmer may develop alternative means of implementing the aforementioned improvements without departing from the scope of the present invention.

It will be understood that certain features and subcombinations are of utility and may be employed without reference to other features and subcombinations and are contemplated within the scope of the claims. Not all steps listed in the various figures need be carried out in the specific order described.

The invention claimed is:

1. An computing equipment management system, comprising:
   a node which is associated with a housing, said housing being adapted to receive a plurality of computing devices, wherein said node is configured to automatically sense insertion of one or more devices that are transferred into said housing, wherein said node is further configured to extract equipment identification information from said one or more devices in response to said insertion and to associate device location information with said equipment identification information;
   said node having a first interface and a second interface; and
   said node adapted to receive said equipment identification information through said first interface from at least one of said plurality and then transmit said equipment identification information and said device location information to an external network-accessible database through said second interface.

2. The system of claim 1 wherein said database is accessed by an application running on an application server.

3. The system of claim 2 wherein said application server is included in an organization's network.

4. The system of claim 1 comprising:
   a second node which is associated with a second housing, said second housing being adapted to receive a plurality of computing devices;
   said second node having a first interface and a second interface; and
   said second node adapted to receive equipment information regarding said plurality of computing devices in said second housing through said first interface of said second node from at least one of plurality of computing devices in said second housing and then transmit said information to said external network-accessible database through said second interface.

5. One or more computer-readable media having computer-useable instructions embodied thereon for performing a method of managing the computing assets of an organization over a network, comprising:
   utilizing a node in said network to automatically sense insertion of one or more devices that are transferred into a housing;
   receiving asset information regarding said one or more devices from said node, said node being associated with said housing, wherein said asset information associates device location information with equipment identification information extracted from said one or more devices;
   maintaining said asset information in a database; and making said asset information available to a plurality of clients over said network.

6. The media of claim 5 wherein said method comprises:
periodically receiving updated asset information from said node according to a schedule.

7. The media of claim 5 wherein said method comprises:
receiving preliminary asset information from said node upon installation of a computing device in a housing associated with said node.

8. The media of claim 7 wherein said method comprises:
causing one of an operating system identification and an IP address to be included in said preliminary asset information received.

9. The media of claim 5 wherein said method comprises:
providing a housing computing device to serve as said node; and
initiating said receiving step using a routine running on said housing computing device.

10. The media of claim 5 wherein said method comprises:
initiating said receiving step according to a schedule included in said computer-readable instructions.

11. The media of claim 5 wherein said method comprises:
including said computer-readable instructions in an application running on a server included in said network.

12. An computing equipment management system, comprising:
a networkable computer which is fixed proximate a housing, said housing being adapted to receive a user's computing equipment, wherein said networkable computer is configured to automatically sense insertion of one or more devices that are transferred into said housing, wherein said networkable computer is further configured to extract equipment identification information from said one or more devices in response to said insertion and to associate device location information with said equipment identification information;
said networkable computer having first and second interfaces and being adapted to receive information regarding one or both of said housing and said equipment through said first interface; and
said second interface adapted to transmit said equipment identification information and said device location information to an external database to be maintained for asset management purposes.

13. The system of claim 12 wherein said database is accessed by an application running on an application server.

14. The system of claim 13 wherein said application server is included in an organization's network.

15. The system of claim 12 comprising:
a second networkable computer on a second housing, said second housing being adapted to receive a plurality of computing devices;
said second networkable computer having a first interface and a second interface; and
said second computer adapted to receive additional equipment information regarding said plurality of computing devices in said second housing through said first interface of said second computer and then transmit said additional information to said external network-accessible database through said second interface of said second computer.

16. An computing equipment management system, comprising:
an automatically-updated memory component associated with a housing, said housing being adapted to receive a plurality of computing devices, wherein said node is configured to automatically sense insertion of one or more devices that are transferred into a housing;
a first interface for receiving asset information from a first device when said first device is installed enabling said asset information to be maintained in said automatically-updated memory component, wherein said asset information associates device location information with equipment identification information extracted from said one or more devices;
a second interface enabling the transfer of said asset information to a database, said database being accessible to at least one client over a network for asset-management purposes.

17. One or more computer-readable media having computer-useable instructions embodied thereon for performing a method of managing the computing assets of an organization over a network, comprising:
collecting a first data set through a first node in said network, said first data set including asset status information regarding a first group of computing assets located in a first housing, wherein said first node is configured to automatically sense insertion of one or more devices that are transferred into said first housing, wherein said asset status information associates device location information with equipment identification information extracted from said one or more devices;
collecting a second data set through a second node in said network, said second data set including said asset status information regarding a second group of computing assets located in a second housing, wherein said second node is configured to automatically sense insertion of one or more devices that are transferred into said second housing; and
maintaining said asset status information in network-accessible database.

18. The media of claim 17 wherein said method comprises:
periodically receiving updated asset status information from said first and second nodes.

19. The media of claim 17 wherein said method comprises:
providing first and second computing devices to serve as said first and second nodes, respectively; and
initiating each of said collecting steps using routines running on said first and second computing devices.

20. The media of claim 17 wherein said method comprises:
initiating said receiving step according to a schedule included in said computer-readable instructions.

* * * * *